United States Patent [19]
Drost et al.

[11] Patent Number: 5,982,834
[45] Date of Patent: Nov. 9, 1999

[54] CLOCK RECOVERY SYSTEM FOR HIGH SPEED SMALL AMPLITUDE DATA STREAM

[75] Inventors: Robert J. Drost, Palo Alto; Robert J. Bosnyak, San Jose, both of Calif.

[73] Assignee: Sun Microsystems, Incorporated, Palo Alto, Calif.

[21] Appl. No.: 08/854,151

[22] Filed: May 9, 1997

[51] Int. Cl.$^6$ .................................................... H04L 7/00
[52] U.S. Cl. ........................................ 375/373; 375/355
[58] Field of Search .................................. 375/360, 371, 375/373, 375, 355; 327/162; 331/18

[56] References Cited

U.S. PATENT DOCUMENTS

| | | | |
|---|---|---|---|
| 4,456,890 | 6/1984 | Carickhoff | 375/376 |
| 4,607,296 | 8/1986 | Smidth | 375/376 |
| 4,641,323 | 2/1987 | Tsang | 375/373 |
| 4,821,297 | 4/1989 | Bergmann et al. | 375/371 |
| 5,566,204 | 10/1996 | Kardontchik et al. | 375/260 |
| 5,592,515 | 1/1997 | Saban et al. | 375/360 |

OTHER PUBLICATIONS

Behzad Razavi, "A2.5–Gb/s 15–mW Clock Recovery Circuit", Apr. 1997, IEEE Journal of Solid–State Circuits, vol. 31 No. 4.

Charles R. Hogge, Jr., "A Self Correcting Clock Recovery Circuit", Dec. 1985, Journal of Lightwave Technology, vol. LT–3 No. 6.

John F. Ewen et al. Single–Chip 1062Mbund CMOS Transceiver for Serial Data Communication, /95 IEEE International Solid–State Circuits Conference.

*Primary Examiner*—Tesfaldet Bocure
*Attorney, Agent, or Firm*—Graham & James LLP

[57] ABSTRACT

A clock recovery system that allows recovery of a clock signal from a high speed, potentially small amplitude data stream. The invention uses a normally avoided property of a non-linear oscillator in the clock recovery system in order to lock the oscillator in phase to an incoming signal. This property relates a characteristic of an oscillator that an oscillator amplifies noise near its inherent frequency; and if the noise is large enough, the oscillator squelches the inherent oscillator frequency signal and outputs a signal locked in frequency and phase to the noise. The clock recovery system comprises a processing circuit, an oscillator, and a control circuit. The processing circuit processes an input data stream to generate a current signal as a first control signal based on data transitions in the input data stream. The first control signal is a "noise signal" to the oscillator. The control circuit outputs a voltage control signal as a second signal to the oscillator based on a difference between an output fed back from the oscillator and a reference frequency signal matching the frequency of the input data stream within a predetermined tolerance range. The second control signal controls the oscillator so that the frequency of the oscillator output is substantially equal to that of the input data stream. Therefore, according to the invention, the oscillator is controlled by the first control signal such that the oscillator output is phase-locked and thus also frequency-locked to the input data stream.

17 Claims, 6 Drawing Sheets

CLOCK RECOVERY SYSTEM FOR HIGH SPEED SMALL AMPLITUDE DATA STREAM

BACKGROUND OF THE INVENTION

The present invention relates to a clock recovery system, and more particularly to an open loop phase locked clock recovery oscillator circuit for recovering a clock signal from a high speed small amplitude data stream.

High speed, low power clock recovery circuits find wide applications in high performance communications systems. For example, clock recovery circuits have been used at the front-end of fiber-optic receivers. Clock recovery circuits allow recovery of a clock signal from a potentially small amplitude data stream so as to regenerate the data stream at its original frequency. Phase detectors are typically used for clock recovery from a non-return-to-zero (NRZ) data stream.

However, when the speed of the data stream is at the limits of the technology, it is impossible to use conventional phase detectors that rely on a phase difference measurement. At extremely high speeds, recovery circuits can only sample the data at the data transition moment to determine a late or early digital phase sample. This is especially true when the clock recovery is performed in CMOS (complementary metal-oxide-semiconductor) for data rates of 2 Giga-bits per second for example. Additionally, conventional analog techniques require a low pass filter to store a control voltage, which takes up large amounts of area in integrated form and is susceptible to noise coupling. Also conventional analog techniques to perform clock recovery can only achieve recovery bandwidths of around 1/50th or less of the data rate due to stability issues as a result of the loop delay, creating destabilizing phase shift.

Continuous time processing clock recovery circuits for example, LC-tuned filters or quadricorrelators have been explored and hold promise of lower power since the extra high speed clocks and circuitry used solely for sampling the data during potential data transitions are avoided. However, it is extremely difficult to accomplish these methods in mainstream digital CMOS.

One form of nonlinear continuous time processing clock recovery circuit has been proposed by B. Razavi in "A2.5-Gb/s 15 m-mW Clock Recovery Circuit," IEEE J. Solid-State Circuits, vol. 31, pp 472–480, April 1996. This article describes the design of a high-speed clock recovery circuit fabricated in a 20 GHz 1-$\mu$m BiCMOS technology. However, the design uses a bipolar system, which is not suitable for CMOS technology. Also, the control loop can present stability problems.

SUMMARY OF THE INVENTION

It is an object of the invention to provide a stable clock recovery system that allows recovery of a clock signal from a high speed, potentially small amplitude data stream.

The invention uses a normally avoided property of a non-linear oscillator in the clock recovery system in order to lock the oscillator in phase to an incoming signal. This property relates to the fact that an oscillator amplifies noise near its inherent frequency.

According to one aspect of the invention, the clock recovery system comprises a processing circuit that processes an input data stream to produce a first control signal at a frequency within a predetermined range. In a preferred embodiment, the processing circuit comprises an edge detector and a voltage controlled current source. The input data stream is provided to the edge detector which then differentiates and rectifies the input data stream to produce a series of pulses each corresponding to a data transition in the input data stream.

According to another aspect of the invention, the clock recovery system includes an oscillator having a first input, a second input and an output. The first control signal is coupled to the first input of the oscillator for controlling the oscillator. In a preferred embodiment, the oscillator is a 3-stage ring voltage controlled oscillator (VCO), and the first control signal has a frequency that is substantially equal to an inherent frequency of the oscillator. The first control signal is a "noise signal" to the oscillator.

According to a further aspect of the invention, the clock recovery system includes a control circuit that outputs a second control signal based on a difference between the oscillator output and a reference frequency signal. The second control signal is coupled to the second input of the oscillator for controlling the oscillator so that the frequency of the oscillator output is substantially equal to that of the input data stream. In a preferred embodiment, the control circuit includes a frequency detector and a low pass filter. The frequency detector compares the output of the oscillator with the reference frequency signal and outputs a comparison result. The low pass filter is coupled to the frequency detector to perform low pass filtering of the comparison result so as to generate the second control signal.

Therefore, the oscillator is controlled by the first control signal such that the oscillator output is phase-locked and thus also frequency-locked to the input data stream. The oscillator output is provided as a recovered clock signal of the input data stream.

Other objects and attainments together with a fuller understanding of the invention will become apparent and appreciated by referring to the following description and claims taken in conjunction with the accompanying drawings.

DETAILED DESCRIPTION OF PREFERRED EMODIMENTS

Figure 1:
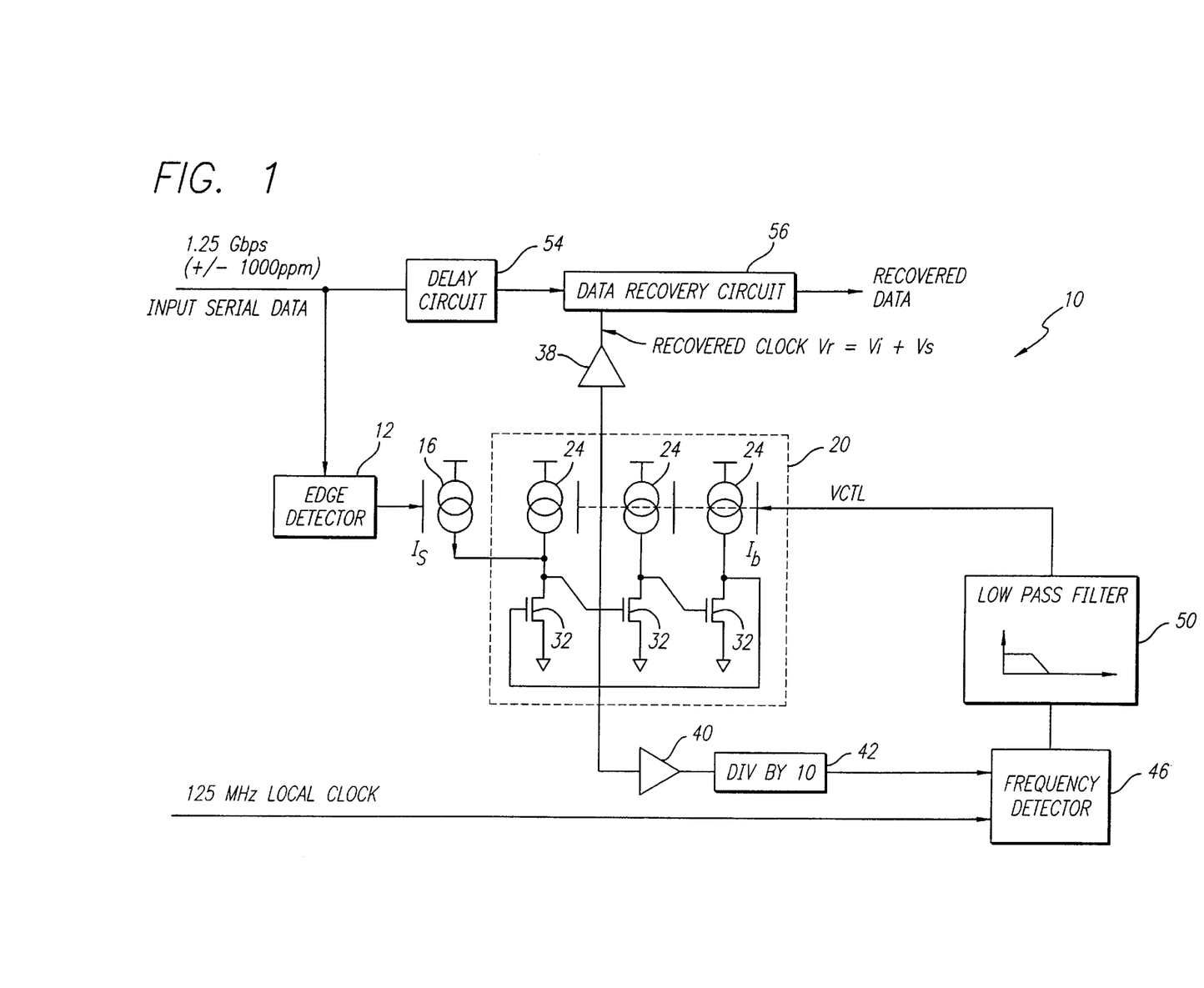
FIG. 1 is a block diagram of a clock recovery system according to a preferred embodiment of the invention.

FIG. 1 shows a block diagram of a clock recovery system 10 for recovering a clock signal of a high speed input serial data according to a preferred embodiment of the invention. Clock recovery system 10 comprises an edge detector 12, a voltage-controlled current source 16, a voltage controlled oscillator (VCO) 20, a divider circuit 40, a frequency detector 46, a low pass filter 50, a delay circuit 54 and a data recovery circuit 56. The input serial data with a high speed of 1.25 Gbps (Gigabits per second) is fed to edge detector 12, which performs nonlinear processing on the input serial data. Edge detector 12 first differentiates the input data to generate a derivative, and then it rectifies this derivative.

Figure 2:
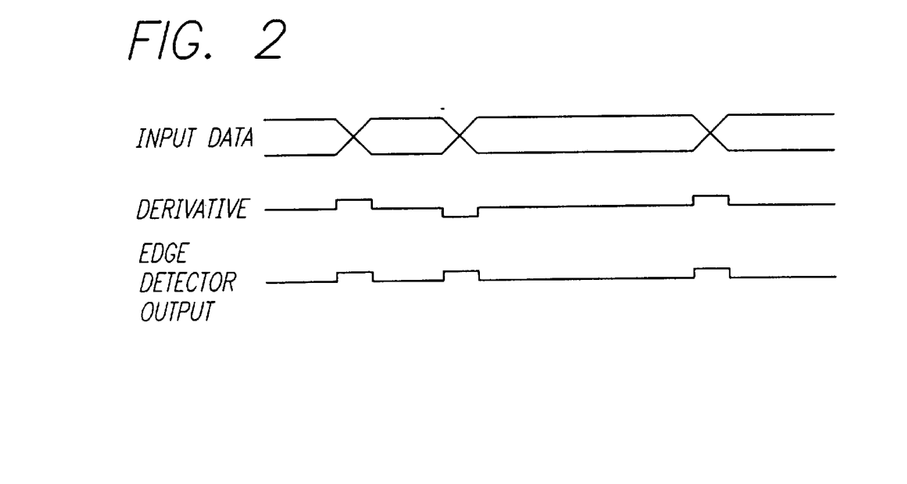
FIG. 2 shows the operations of an edge detector according to the embodiment of FIG. 1.

An example of an input data, the derivative of the input data and an output of edge detector 12 are illustrated in FIG. 2. As illustrated in FIG. 2, the derivative of the input data is a sequence of pulses, each representing a transition of the input data from either 0 to 1 or from 1 to 0. The derivative signal is rectified so that all of the pulses are rectified in one direction, and rectified pulses are output by edge detector 12.

The output of edge detector 12 is a series of voltage pulses which are fed to voltage controlled current source 16, as shown in FIG. 1. In the preferred embodiment, current source 16 is made of a p-type MOS transistor. Current source 16 provides a current signal $I_s$ to VCO 20 in response to the voltage output by edge detector 12. Thus, current source 16 provides a current pulse into VCO 20 each time the input serial data has a data transition. The current signal $I_s$ is at a frequency extremely close to the inherent frequency of VCO 20, which is set by $V_{ctl}$ which is created by the frequency lock loop elements 42, 46, and 50. In this way, the output of VCO 20 is phase locked to the frequency of the input serial data, as will be described below.

In the preferred embodiment, VCO 20 is a 3-stage ring oscillator, although other types of ring oscillators may be used. Each stage of VCO 20 includes a voltage controlled current source 24 coupled to an n-type MOS transistor 32. Current source 24 is also preferably made of a p-type MOS transistor. VCO 20 is controlled by voltage signal $V_{ctl}$ and by current signal $I_s$. The output of VCO 20 is provided to data recovery circuit 56 as the recovered clock signal $V_r$ of the input serial data via a buffer circuit 38. The output of VCO 20 is also fed back, via a buffer circuit 40 to frequency divider circuit 42 for generating voltage control signal $V_{ctl}$. The recovered clock signal $V_r$ includes two components $V_i$ and $V_s$. $V_i$ is an output of VCO 20 when only $V_{ctl}$ is applied; and $V_s$ is an output of VCO when $I_s$ is applied and of sufficient amplitude and close enough frequency to $V_i$.

VCO 20 is controlled by voltage signal $V_{ctl}$ so that the inherent frequency of VCO 20 (i.e., when only $V_{ctl}$ is applied) is very close to the frequency of the input serial data. This is achieved by locking VCO 20 to a local clock signal whose frequency is set to match the rate of the input serial data to within for instance, 1,000 ppm (parts per million). The local clock signal is generally available in the system in which the invention is implemented. The local clock signal may be also be generated separately. The local clock signal and the output of frequency divider 42 are fed to a frequency detector 46, as will be further described below.

Figure 3:
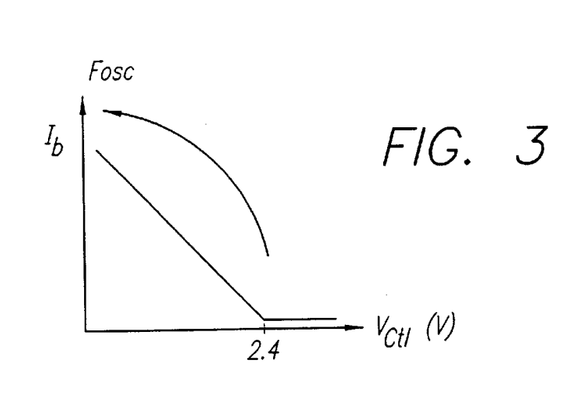
FIG. 3 illustrates the frequency operation region of a voltage controlled oscillator according to the embodiment of FIG. 1.

FIG. 3 illustrates the frequency operation region of VCO 20. As voltage control signal $V_{ctl}$ decreases to 2.4 V, the p-MOS transistor of current source 24 to which $V_{ctl}$ is applied is turned on. Thus a bias current $I_b$ is generated in the current source and VCO 20 starts to operate. As $V_{ctl}$ further decreases, both the bias current $I_b$ and the frequency of VCO 20 increase.

Figure 4:
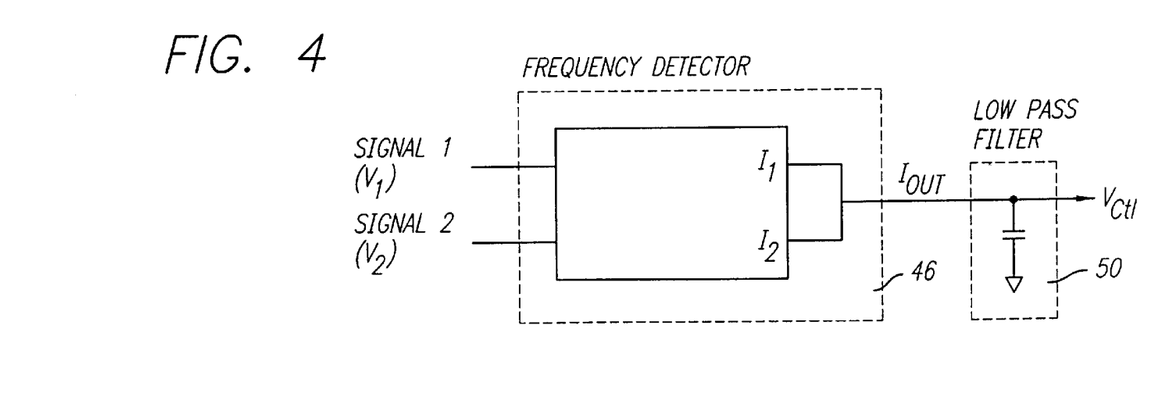
FIG. 4 illustrates an equivalent circuit representation of a frequency detector and a low pass filter according to a preferred embodiment of the invention.

FIG. 4 illustrates an equivalent circuit representation of frequency detector 46 and low pass filter 50 and their operations in a preferred embodiment of the invention. Frequency detector 46 is essentially a frequency to current converter. Input voltage signals $V_1$ and $V_2$ are input to frequency detector 46 and are converted to current signals $I_1$ and $I_2$, respectively. The average of the output current $I_{out}$ is proportional to the frequency difference of the input signals as shown below:

$$I_{out}(\text{average})=k_F(F_1-F_2),$$

where $k_F$ is a proportional constant; $F_1$ is the frequency of $V_1$; and $F_2$ is the frequency of $V_2$.

Low pass filter 50 includes a capacitor connected, at its one end, to the ground. Low pass filter 50 integrates the current output $I_{out}$ from frequency detector 46 to generate the voltage control signal $V_{ctl}$, as will be further described below.

Figure 5:
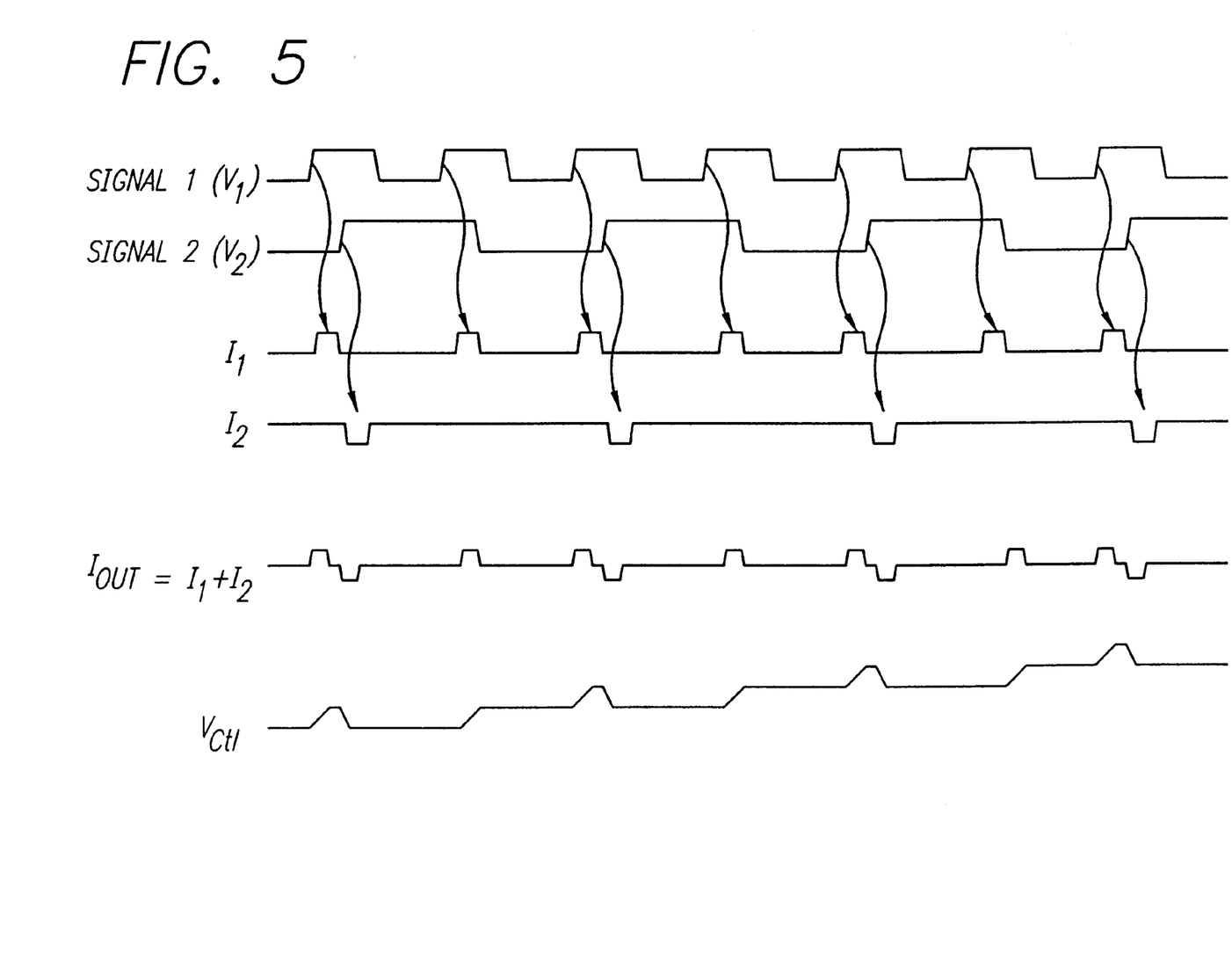
FIG. 5 shows various timing diagrams illustrating the operation of the circuit in FIG. 4.

FIG. 5 shows timing diagrams of the various input and output signals of the circuit in FIG. 3. As illustrated in FIG. 5, a pulse is generated in current signal I, whenever $V_1$ has a transition from a low level to a high level. Similarly, a pulse is generated in current signal $I_2$ whenever $V_2$ has a transition from a low level to a high level. The pulses in $I_1$ and $I_2$ are in different directions. The sum of the two current signals $I_1$ and $I_2$ are added together to generate the current output $I_{out}$, which is then integrated by low pass filter 50 to produce the voltage control signal $V_{ctl}$.

Frequency detector 46 allows the feedback output signal of VCO 20 to be compared with the local clock frequency. The comparison results are used to generate and adjust the control voltage $V_{ctl}$ to control VCO 20 so as to lock VCO 20 to the local clock signal. In this way, the inherent frequency of VCO 20 is controlled to be very close to the frequency of the input serial data.

As described above, VCO 20 is controlled by both control voltage $V_{ctl}$ and current signal $I_s$. A linear analysis of VCO 20 shows that there could be two components in the output signal from VCO 20. These two components include a signal $V_i$ at the inherent frequency of VCO 20 as a result of applying the control voltage $V_{ctl}$ to VCO 20 and a signal $V_s$ at the frequency of current signal $I_s$ as a result of applying $I_s$ to VCO 20. When both $V_{ctl}$ and $I_s$ are applied to VCO 20, the output of VCO 20 is the recovered clock $V_r$, i.e., the sum of $V_i$ and $V_s$. By setting the amplitude of current signal $I_s$ large enough (for instance in a 0.6 $\mu$m CMOS technology 5–100 $\mu$A is a typical range), the output of VCO 20 shifts its frequency entirely and locks into the frequency $I_s$. In practice, however, the amplitude of $I_s$ does not need to be too large since the loop provides a significant gain when the frequency of $I_s$ is very close to the inherent frequency of the VCO.

The mechanism by which the output of VCO 20 is phase locked to the frequency of current signal $I_s$ is described below in more detail.

Figure 6:
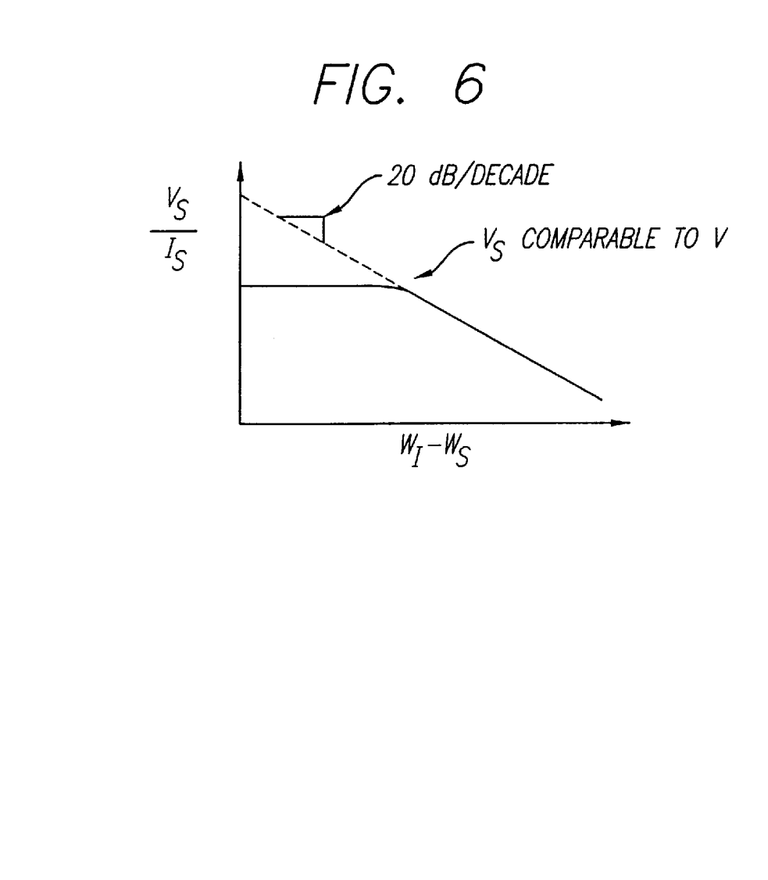
FIG. 6 shows the relationship between a transfer function $V_s/I_s$ and a frequency difference $W_r - W_s$.

FIG. 6 shows the relationship between the transfer function $V_s/I_s$ and frequency difference $W_i-W_s$, i.e., the difference between the inherent frequency $W_i$ of VCO 20 and the frequency of $W_s$ of $I_s$. As shown, the gain of the transfer function $V_s/I_s$ increases as $W_s$ approaches $W_i$, i.e., as $W_i-W_s$ decreases. FIG. 6 also illustrates that when the amplitude of $V_s$ becomes comparable to $V_i$, then VCO 20 enters into a new mode of oscillation where the signal $V_i$ at frequency $W_i$ is suppressed as VCO 20 only outputs the signal $V_s$ as the recovered clock $V_r$ at frequency $W_s$. The amplitude of $V_s$ will be limited by the nonlinearies of the VCO due to saturation, and thus the transfer function $V_s/I_s$ flattens in this region. In other words, when edge detector 12 provides a sufficient current signal $I_s$ to VCO 20, the amplitude of $V_s$ reaches its maximum value and will not increase any further even if $I_s$ increases. However, as described above, in practice the amplitude of $I_s$ does not need to be too large since the loop provides significant gain when the frequency $W_s$ of $I_s$ is very close to the inherent frequency $W_i$. This is automatically done since the data rate and local clock will have some maximum ppm deviation.

Figure 7:
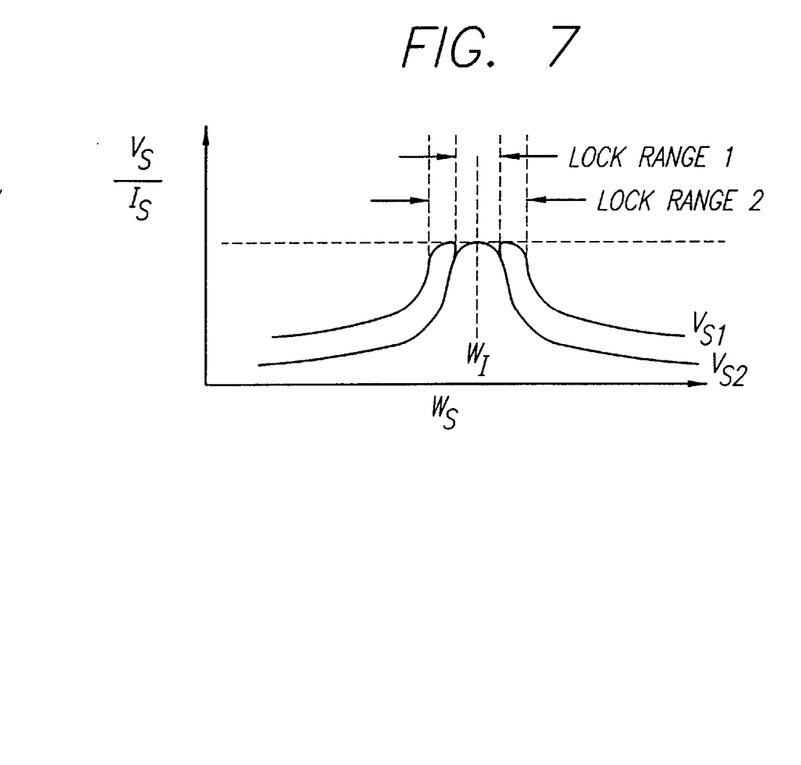
FIG. 7 illustrates the relationship between the transfer function $V_s/I_s$ and the frequency $W_s$ at different amplitudes of $V_s$.

FIG. 7 illustrates the relationship of the transfer function $V_s/I_s$ and the frequency $W_s$ of $I_s$ when current signals $I_{s1}$ and $I_{s2}$ with different amplitudes are applied to VCO 20. In FIG. 7, $V_{s1}$ and $V_{s2}$ are generated by VCO 20 by applying $I_{s1}$ and $I_{s2}$, respectively, to VCO 20, $I_{s1}$ being greater than $I_2$. The flattened region of $V_s/I_s$ indicates the range in which VCO 20 is phase locked to the frequency $W_s$. The width of the flattened region and thus the lock range of the VCO will change depending on the amplitude of the current signal $I_s$. The curves in FIG. 7 show an expanded lock range associated with $V_{s1}$, i.e., lock range 2, for the case where current signal $I_{s1}$ with a larger amplitude is applied to VCO 20. FIG. 7 also shows that a larger current signal $I_{s1}$ makes frequency locking earlier. However, since the frequency difference $W_i-W_s$ is so small in the clock recovery system (i.e., maximum is 1.25 MHz out of 1.25 GHz), it is not difficult to supply a current $I_s$ with sufficient amplitude so that the lock range includes all input data frequencies of interest.

Figure 8:
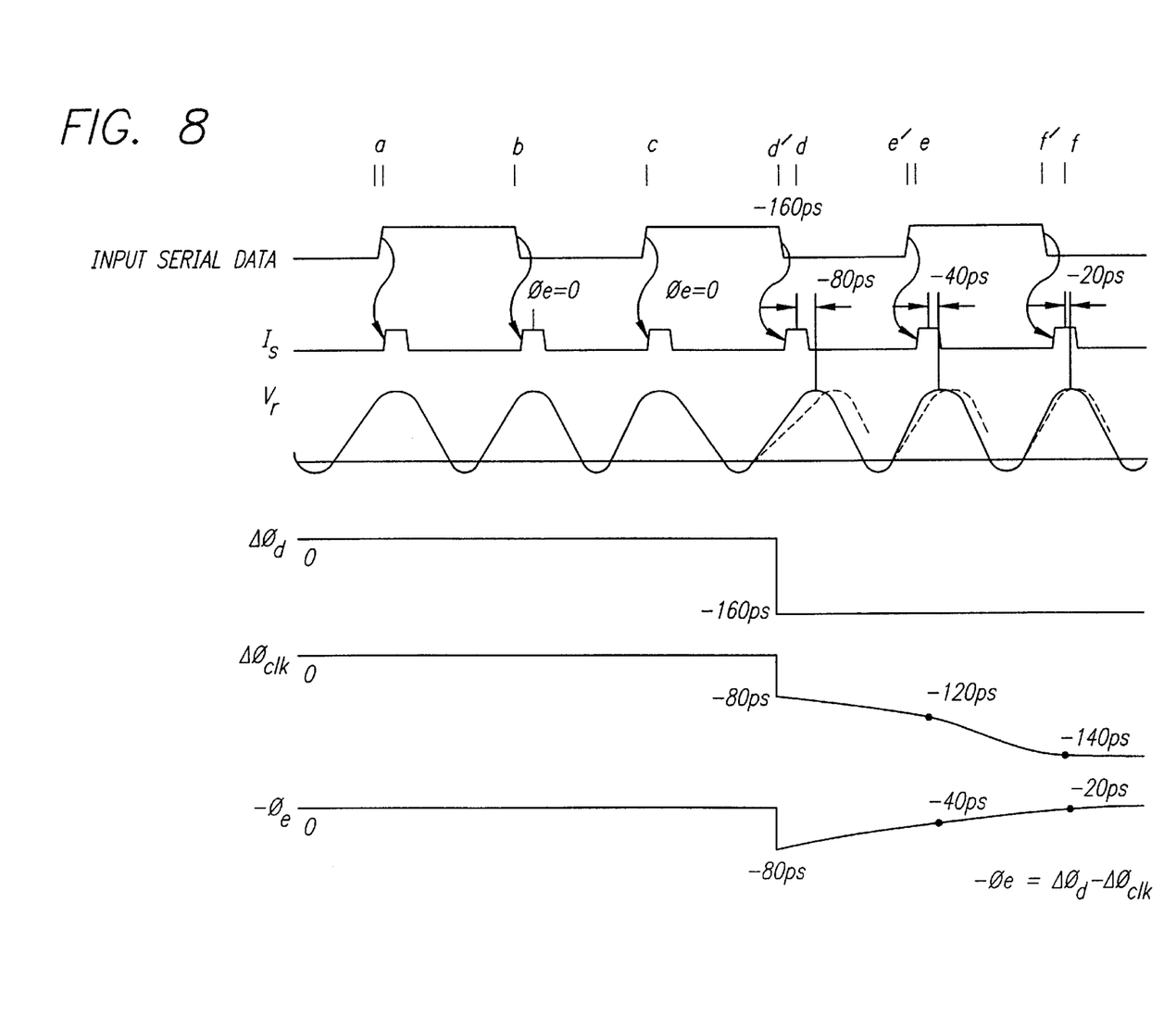
FIG. 8 illustrates how the phase error between a phase shift in the input data stream and a phase shift in the recovered clock signal $V_r$ is corrected according to the invention.

Frequently, there is a phase shift in the input serial data due to digital or analog signals coupling noise on-chip in the package, on the PC boards, or in the cables. Consequently, the data phase shift results in data transitions occurring at new positions. FIG. 8 illustrates this phenomenon and shows how the present invention corrects the phase errors. As shown in FIG. 8, the positions of expected data transitions are a to f. At positions a to c, there are no phase shifts in the input serial data and so the data phase differences $\Delta\Phi_d$ between the positions of the expected data transitions and the positions of the actual data transitions are zero. Similarly at positions a to c, the recovered clock phase differences $\Delta\Phi_{clk}$ between the positions of the expected clock transitions and the positions of the actual clock transitions are zero. Thus, at positions a to c, the phase errors $\Phi_e$ between the data phase difference $\Delta\Phi_d$ and the recovered clock phase difference $\Delta\Phi_{clk}$ are zero. Accordingly, the actual recovered clock signal $V_r$ is locked to the frequency of the input serial data.

Thereafter, however, due to a phase shift in the input serial data, the data transition occurs at positions d', e', and f', instead of at expected positions d, e, and f, respectively. In this example, it is assumed that at position d', there is a data phase shift of $-160$ ps (picosecond). It is further assumed that the ratio factor R of edge detector 12 (FIG. 1) is 0.5. Edge detector 12 operates in such a way that when there is a phase shift $\Delta\Phi_d$ in the input serial data, edge detector 12 cause s current signal $I_s$ to create a phase shift in $\Delta\Phi_{clk}$ of $\Delta\Phi_d R$ upon occurrence of the first new data transition, a phase shift of $\Delta\Phi_d R^2$ upon occurrence of the second new data transition, a phase shift of $\Delta\Phi_d R^3$ upon occurrence of the third new data transition and so on. In this example, the clock signal $\Delta\Phi_{clk}$ has the phase shifts of $-80$ ps, $-40$ ps, and $-20$ ps at positions d', e' and f', respectively, as shown in FIG. 8. In FIG. 8, the dashed line curve $V_r$ indicates the recovered clock signal, as it would look if the phase correcting current pulse $I_s$ was not applied, and the solid line represents the actual recovered clock signal.

The phase error $-\Phi_e$ is represented as follows:

$$-\Phi_e = \Delta\Phi_d - \Delta\Phi_{clk}$$

As shown in FIG. 8, as the serial data are being input to the edge detector and new data transitions occur at positions d', e' and f', $\Delta\Phi_{clk}$ is changing exponentially and is $-80$ ps, $-120$ ps, and $-140$ ps, respectively at these positions. Thus $\Delta\Phi_{clk}$ is corrected by $I_s$ to become close to $\Delta\Phi_d$. Eventually, $\Delta\Phi_{clk}$ is equal to $\Delta\Phi_d$, and at this time the actual recovered clock signal is again locked to the frequency of the input serial data. The phase lock occurs when the pulse center of the current signal $I_s$ is aligned with the maximum amplitude of the recovered clock signal $V_r$.

Figure 9A:
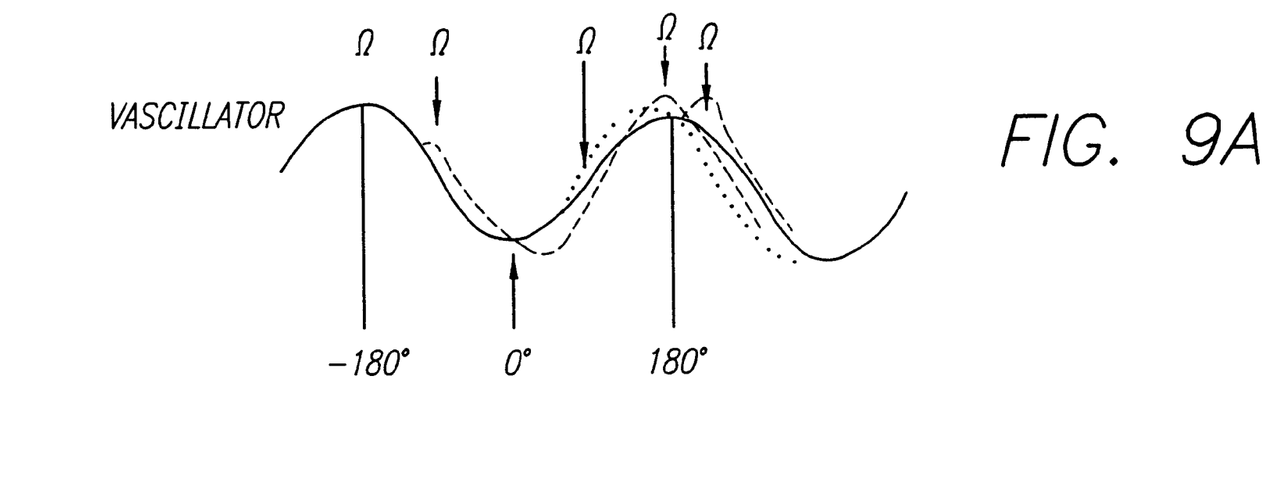
FIGS. 9A and 9B illustrate the effects of various phase shifts in the current signal $I_s$ on the actual recovered clock signal $V_r$.
Figure 9B:
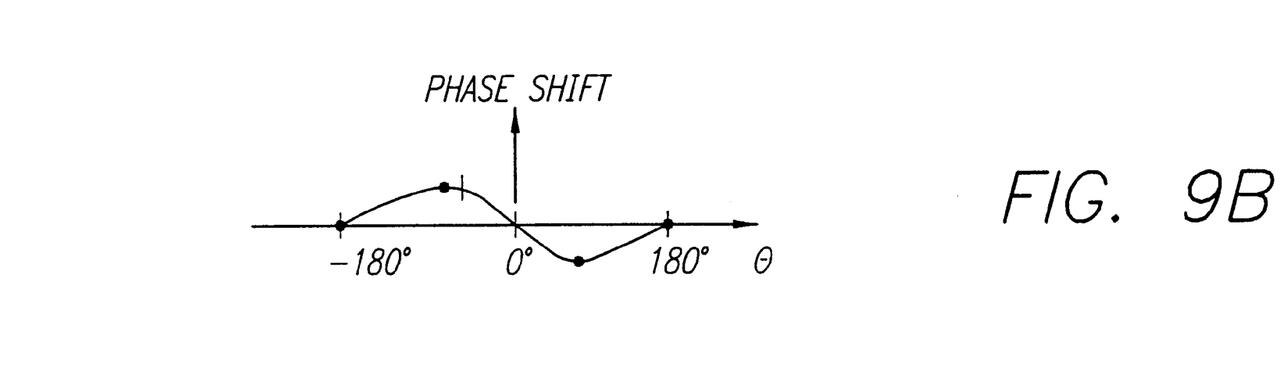

FIG. 9A illustrates the effects of various phase shifts in current signal $I_s$ on the phase shift in the actual recovered clock signal $V_r$. FIG. 9B shows the phase difference between the phase of the current signal $I_s$ and the phase of the actual recovered clock signal $V_r$. As can be seen from FIGS. 9A and 9B, when the centers of the current pulses are aligned with the maximum amplitudes of the recovered clock signal at $-180°$ and $+180°$, the phase correction $\theta$ is 0. The dashed lines in FIG. 9A represent the resulting shift of the recovered clock signal.

While the invention has been described in conjunction with specific embodiments, it is evident that many alternatives, modifications and variations will be apparent to those skilled in the art in light of the foregoing description. Accordingly, it is intended to embrace all such alternatives, modifications and variation as fall within the spirit and scope of the appended claims and their equivalents.

What is claimed is:

1. A clock recovery system comprising:

a processing circuit, including an edge detector and a voltage controlled current source, that processes an input data stream to produce a first control signal at a frequency within a predetermined range, wherein the edge detector differentiates the input data stream to generate a derivative signal and rectifies the derivative signal to produce a series of pulses each corresponding to a data transition in the input data stream, and the voltage controlled current source is coupled to the edge detector and responsive to the series of pulses produced by the edge detector to output a current signal as the first control signal;

an oscillator having a first input, a second input and an output, wherein the first control signal is coupled to the first input of the oscillator for controlling the oscillator; and a control circuit that outputs a second control signal based on a difference between the oscillator output and a reference frequency signal, the second control signal being coupled to the second input of the oscillator for controlling the oscillator so that the frequency of the oscillator output is substantially equal to that of the input data stream;

wherein the oscillator is controlled by the first control signal such that the oscillator output is phased-locked to the frequency of the input data stream and is provided as a recovered clock signal of the input data stream.

2. The clock recovery system of claim 1, wherein the first control signal has an amplitude not less than a predetermined value so as to cause the oscillator to output the recovered clock signal that is phase locked to the input data stream.

3. The clock recovery system of claim 1, wherein the frequency of the first control signal is substantially equal to an inherent frequency of the oscillator when only the second control signal is input to the oscillator.

4. The clock recovery system of claim 1, wherein the first control signal has an amplitude not less than a predetermined value so as to cause the oscillator to output the recovered clock signal that is phase locked to the input data stream.

5. The clock recovery system of claim 1, wherein the frequency of the first control signal is substantially equal to an inherent frequency of the oscillator when only the second control signal is input to the oscillator.

6. The clock recovery system of claim 1, wherein the oscillator comprises a voltage controlled, three stage ring oscillator.

7. The clock recovery system of claim 1, wherein the control circuit comprises:
a frequency detector that compares the output of the oscillator with the reference frequency signal and outputs a comparison result; and
a low pass filter coupled to the frequency detector to perform low pass filtering of the comparison result so as to generate the second control signal.

8. The clock recovery system of claim 1, wherein the reference frequency signal is a local clock signal that matches the frequency of the input data stream within a predetermined tolerance range.

9. The clock recovery system of claim 1, wherein when there is a phase shift in the input data stream, the processing circuit causes a corresponding phase shift in the first control signal by a predetermined ratio factor, such that a phase error between the phase shift in the input data stream and that in the recovered clock signal is gradually corrected, and the recovered clock signal is eventually phase-locked to the frequency of the input data stream.

10. The clock recovery system of claim 1, wherein when there is a phase shift in the input data stream, the processing circuit causes a corresponding phase shift in the first control signal by a predetermined ratio factor, such that a phase error between the phase shift in the input data stream and that in the recovered clock signal is gradually corrected, and the recovered clock signal is eventually phase-locked to the frequency of the input data stream.

11. A clock recovery system for recovering a clock signal from a high speed input data stream, the system comprising:
an edge detector that differentiates the input data stream to generate a derivative signal and rectifies the derivative signal to produce a series of pulses each corresponding to a data transition in the input data stream;
a voltage controlled current source coupled to the edge detector and responsive to the series of pulses produced by the edge detector to output a current signal as a first control signal;
a voltage controlled oscillator having a first input, a second input and an output, wherein the first control signal is coupled to the first input of the oscillator for controlling the oscillator, wherein the first control signal has a frequency substantially equal to an inherent frequency of the oscillator;
a frequency detector that compares the output of the oscillator with a reference frequency signal and outputs a comparison result, the reference frequency signal matching the frequency of the input data stream within a predetermined tolerance range; and
a low pass filter coupled to the frequency detector to perform low pass filtering of the comparison result so as to generate a second control signal, the second control signal being coupled to the second input of the oscillator for controlling the oscillator so that the frequency of the oscillator output is substantially equal to that of the input data stream;
wherein the oscillator is controlled by the first control signal such that the oscillator output is phased-locked to the frequency of the input data stream and is provided as a recovered clock signal of the input data stream.

12. A clock recovery system for recovering a clock signal from a high speed input data stream, the system comprising:
an edge detector that differentiates the input data stream to generate a derivative signal and rectifies the derivative signal to produce a series of pulses each corresponding to a data transition in the input data stream;
a voltage controlled current source coupled to the edge detector and responsive to the series of pulses produced by the edge detector to output a current signal as a first control signal;
a voltage controlled oscillator having a first input, a second input and an output, wherein the first control signal is coupled to the first input of the oscillator for controlling the oscillator, wherein the first control signal has a frequency substantially equal to an inherent frequency of the oscillator;
a frequency detector that compares the output of the oscillator with a reference frequency signal and outputs a comparison result, the reference frequency signal matching the frequency of the input data stream within a predetermined tolerance range; and
a low pass filter coupled to the frequency detector to perform low pass filtering of the comparison result so as to generate a second control signal, the second control signal being coupled to the second input of the oscillator for controlling the oscillator so that the frequency of the oscillator output is substantially equal to that of the input data stream;
wherein the oscillator is controlled by the second control signal such that the oscillator is phased-locked to the frequency of the input data stream and produces the output as a recovered clock signal of the input data stream.

13. The clock recovery system of claim 12, further comprising:
a delay circuit coupled to receive the input data stream and provide a delayed copy of the input data stream; and
a data recovery circuit coupled to the delay circuit and the output of the oscillator, the data recovery circuit outputting a recovered data stream corresponding to the input data stream in accordance with the recovered clock signal.

14. The clock recovery system of claim 13, wherein the data recovery circuit comprises a D-type flip flop.

15. A method of recovering a clock signal from an input data stream, comprising the steps of:
differentiating the input data stream to generate a derivative signal and rectifying the derivative signal to produce a series of pulses each corresponding to a data transition in the input data stream;
generating a current signal as a first control signal, in response to the series of pulses, at a frequency within a predetermined range;
controlling an oscillator by using the first control signal;
providing a second control signal based on a difference between the oscillator output and a reference frequency signal; and
controlling the oscillator by using the second control signal so that the frequency of an output of the oscillator is substantially equal to that of the input data stream;
wherein the oscillator is controlled by the second control signal such that the oscillator is phased-locked to the frequency of the input data stream and produces the output as a recovered clock signal of the input data stream.

16. The method of claim 14, wherein the first control signal has an amplitude not less than a predetermined value so as to cause the oscillator to output the recovered clock signal that is phase locked to the input data stream.

17. The method of claim 14, wherein the frequency of the first control signal is substantially equal to an inherent frequency of the oscillator when only the second control signal is input to the oscillator.

* * * * *